United States Patent
Subramanya et al.

(10) Patent No.: US 11,314,012 B2
(45) Date of Patent: Apr. 26, 2022

(54) RAYLEIGH SPACING LIMITED AND LOW Z-HEIGHT LED ARRAYS

(71) Applicant: Lumileds LLC, San Jose, CA (US)

(72) Inventors: Sudhir Subramanya, Dublin, CA (US); Willem Sillevis-Smitt, San Jose, CA (US); Frederic Diana, San Jose, CA (US); Charles Schrama, San Jose, CA (US); Alan McReynolds, San Jose, CA (US); Yifeng Qiu, San Jose, CA (US)

(73) Assignee: Lumileds LLC, San Jose, CA (US)

( * ) Notice: Subject to any disclaimer, the term of this patent is extended or adjusted under 35 U.S.C. 154(b) by 179 days.

(21) Appl. No.: 16/584,628

(22) Filed: Sep. 26, 2019

(65) Prior Publication Data

US 2020/0103091 A1    Apr. 2, 2020

Related U.S. Application Data

(60) Provisional application No. 62/738,607, filed on Sep. 28, 2018.

(30) Foreign Application Priority Data

Dec. 11, 2018  (EP) .................................... 18211515

(51) Int. Cl.
*F21V 8/00* (2006.01)
*F21K 9/23* (2016.01)
(Continued)

(52) U.S. Cl.
CPC .............. *G02B 6/0073* (2013.01); *F21K 9/23* (2016.08); *F21V 5/004* (2013.01);
(Continued)

(58) Field of Classification Search
CPC .............................. G02B 6/0073; G02B 5/045
See application file for complete search history.

(56) References Cited

U.S. PATENT DOCUMENTS

| 6,948,838 B2 | 9/2005 | Künstler |
| 7,229,199 B2 | 6/2007 | Lee et al. |

(Continued)

FOREIGN PATENT DOCUMENTS

| WO | 2018/185475 A1 | 10/2018 |
| WO | 2020069443 A1 | 4/2020 |

OTHER PUBLICATIONS

USPTO Final Office Action in U.S. Appl. No. 16/584,635 dated Feb. 4, 2021, 24 pages.

(Continued)

*Primary Examiner* — Andrew J Coughlin (57) ABSTRACT

A light source useful for architectural lighting, general lighting, street lighting, or other lighting applications includes a plurality of light emitting diodes, with at least some light emitting diodes sized between 50 microns and 500 microns. A plurality of micro-optics sized less than 1 millimeter are positioned over at least some of the plurality of light emitting diodes. Each combination of light emitting diode and associated micro-optic is positioned within a Rayleigh distance to each other, sufficient to both present a substantially uniform visual appearance and provide a substantially uniform light beam. In some embodiments the height of the light emitting diodes, their supporting substrate and electrical traces, and associated optics is less than 5 millimeters.

18 Claims, 5 Drawing Sheets

(51) Int. Cl.
  *H01L 27/15* (2006.01)
  *F21V 29/75* (2015.01)
  *F21V 29/76* (2015.01)
  *F21V 5/00* (2018.01)
  *F21V 19/00* (2006.01)
  *F21Y 105/16* (2016.01)
  *F21Y 113/13* (2016.01)
  *F21Y 115/10* (2016.01)

(52) U.S. Cl.
  CPC .......... *F21V 19/0025* (2013.01); *F21V 29/75* (2015.01); *F21V 29/763* (2015.01); *G02B 6/0035* (2013.01); *H01L 27/156* (2013.01); *F21Y 2105/16* (2016.08); *F21Y 2113/13* (2016.08); *F21Y 2115/10* (2016.08); *G02B 6/0085* (2013.01)

(56) References Cited

U.S. PATENT DOCUMENTS

| | | | |
|---|---|---|---|
| 8,573,822 B2 | 11/2013 | Ishihara | |
| 8,746,909 B2 * | 6/2014 | Chen | G02B 6/0025 362/97.1 |
| RE47,241 E * | 2/2019 | D'Evelyn | H01L 33/50 |
| 2007/0058359 A1 | 3/2007 | Saitoh et al. | |
| 2009/0009506 A1 | 1/2009 | Lee et al. | |
| 2011/0315956 A1 | 12/2011 | Tischler et al. | |
| 2015/0295154 A1 * | 10/2015 | Tu | H01L 33/0093 438/27 |
| 2016/0123541 A1 | 5/2016 | Quilici et al. | |
| 2016/0298822 A1 | 10/2016 | Michiels et al. | |
| 2016/0363747 A1 | 12/2016 | Krijn et al. | |
| 2017/0102125 A1 | 4/2017 | Saito | |
| 2017/0254518 A1 | 9/2017 | Vasylyev | |
| 2018/0136463 A1 | 5/2018 | Nambara | |
| 2020/0103091 A1 | 4/2020 | Subramanya et al. | |
| 2020/0103581 A1 | 4/2020 | Subramanya et al. | |
| 2020/0105827 A1 | 4/2020 | Subramanya et al. | |

OTHER PUBLICATIONS

USPTO Non-Final Office Action in U.S. Appl. No. 16/584,641 dated Feb. 17, 2021, 20 pages.
USPTO Nonfinal Office Action issued in U.S. Appl. No. 16/584,635 dated Oct. 1, 2020; 20 pages.
International Search Report corresponding to PCT/US2019/053656 dated Nov. 27, 2019, 6 pages.
Written Opinion of the International Searching Authority corresponding to PCT/US2019/053656 dated Nov. 27, 2019, 6 pages.
USPTO Notice of Allowance in U.S. Appl. No. 16/584,635 dated Aug. 18, 2021, 7 pages.

* cited by examiner

RAYLEIGH SPACING LIMITED AND LOW Z-HEIGHT LED ARRAYS

CROSS REFERENCE TO RELATED APPLICATIONS

This application claims benefit of priority to U.S. Provisional Patent Application No. 62/738,607 filed Sep. 28, 2018 and to European Patent Application No. 18211515.4 filed Dec. 11, 2018, each of which is incorporated herein by reference in its entirety. Further, this application is related to co-pending U.S. Non-provisional patent application Ser. No. 16/584,635 filed Sep. 26, 2019 and U.S. Non-provisional patent application Ser. No. 16/584,641 filed Sep. 26, 2019.

TECHNICAL FIELD

The present disclosure relates generally dynamic lighting control of micro-LED lighting systems. In certain embodiments, low Z-height LED arrays with associated micro-optics are used.

BACKGROUND

Commonly available LED lighting fixtures that support high light output often include centimeter scale optics and packaging. Large LED dies with 1 $mm^2$ or larger light emitting areas can be used. For high output spot lighting (1,500 lumen and above), it is not uncommon to use chip-on-board LEDs with a diameter of 9 mm or larger. When forming a tight beam (example 36° or less), the optic forming the beam can require a centimeter scale Z-height packaging, and additional Z-height can be associated with diffusers, mirrors, or light modification structures. Even more Z-height can be attributed to millimeter to centimeter scale cooling or heat transfer structures, electronic components, mounting elements, or multiple layer printed circuit boards. In effect, available high power and narrow beam LEDS can appear large and clunky, are often limited to a narrow range of predominantly circular or cylindrical shapes and are costly manufacture due to the need for molding or forming large optical pieces.

Simply replacing a large LED with a number of smaller LEDs having a similar total luminous output does not provide an adequate solution. Instead of a single optic or diffuser that presents a relatively uniform appearance, multiple optics can provide an unsatisfactory cluttered appearance. Typically, the LED package appearance and projected light of such LED systems is not uniform, with bright spots and shadowing being present in the LED package, and individual projected beams being recognizable in illuminated areas. Further, due to separated light beams, illuminated objects will appear to have multiple shadows in response to direct illumination. LED systems that have a low Z-height, present a uniform visual appearance, and minimize shadowing or other visual artifacts of multiple beams are needed.

SUMMARY

In one embodiment, a programmable light source useful for architectural lighting, general lighting, street lighting, or other lighting applications includes a plurality of light emitting diodes, with at least some light emitting diodes sized between 30 microns and 500 microns. A plurality of micro-optics sized less than 1 millimeter are positioned over at least one of the plurality of light emitting diodes. Typically, the micro-optics are sized to be similar or larger in size than the light emitting diodes. Each combination of light emitting diode and associated micro-optic is positioned within a distance to each other sufficient to both present a substantially uniform visual appearance and provide a substantially uniform light beam. This distance can be selected so the combined light emitting diode and associated micro-optic are positioned to be separated by no more than a Rayleigh limit distance calculated for a user at a normal distance from the light source. In some embodiments, each of the plurality of light emitting diodes are positioned at least 1 millimeter apart.

In some embodiments a controller is connected to selectively power groups of the plurality of light emitting diodes to provide different light beam patterns.

In some embodiments the height of the light emitting diodes, their supporting substrate and electrical traces, and associated micro-optics is less than 5 millimeters.

In some embodiments light emitting diodes can be embedded in a solid or a flexible substrate, which can be at least in part transparent. For example, the light emitting diodes can be at least partially embedded in glass, ceramic, or polymeric materials. At least some of the plurality of light emitting diodes can be individually controlled through connected electrical traces. In other embodiments, groups or sub-groups of light emitting diodes can be controlled together.

In some embodiments the plurality of light emitting diodes can have distinct non-white colors. For example, at least four of the plurality of light emitting diodes can be RGBY groupings of light emitting diodes.

In another embodiment, at least two of the plurality of light emitting diodes are positionable under a single micro-optic. Alternatively, each light emitting diodes can be positioned under a single micro-optic. Some of the plurality of light emitting diodes can be positioned under a single on-axis micro-optic, while others can be positioned under a single off-axis micro-optic. In some embodiments the micro-optics are defined in an optical sheet positionable over at least some of the plurality of light emitting diodes.

DETAILED DESCRIPTION

Figure 1A:
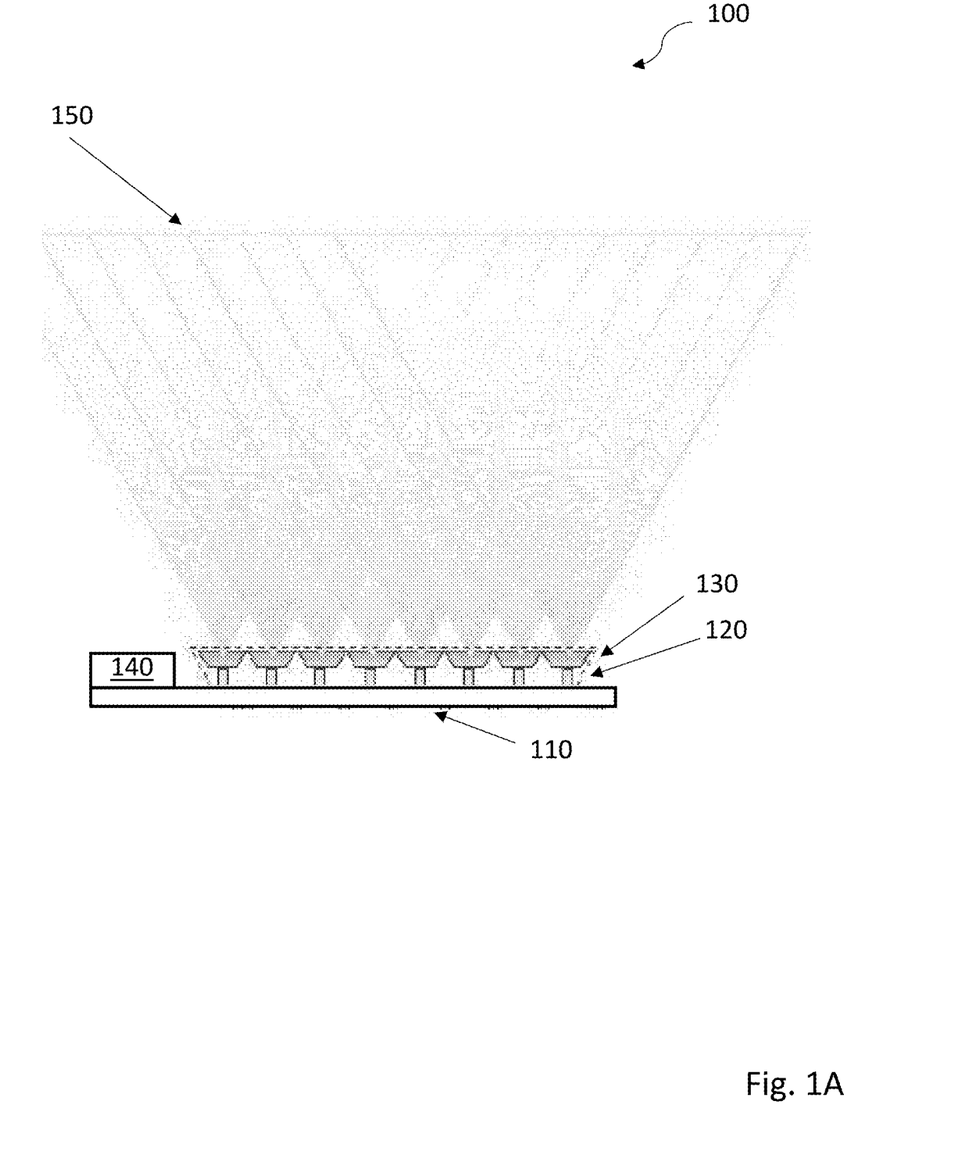
FIG. 1A is a diagram illustrating a LED illumination system with multiple millimeter-scale spaced apart LEDs and micro-optics supported by a substrate.

FIG. 1A is a diagram illustrating a LED illumination system 100 with multiple millimeter-scale spaced-apart LEDs 120 that form a sparse array, and associated micro-optics 130 supported by a substrate 110. LED activation and light intensity can be controlled by controller 140. Light emitted from LEDs 120 follow light beam paths 150. The light beam paths can be substantially distinct or at least partially overlapping as indicated in FIG. 1.

In some embodiments, at least some LEDs 120 are sized between 30 microns and 500 microns in length, width, and height. The micro-optics 130 are sized to be less than 1 millimeter in length, width, and height and are positioned over at least some of the LEDs 120. Typically, the micro-optics are sized to be similar or larger in size than the LEDs 120. In some embodiments the height of the LEDs 120, their supporting substrate and any electrical traces, and associated micro-optics 130 is less than 5 millimeters in combination.

The controller 140 is connected to selectively power groups LEDS 120 to provide different light beam patterns 150. The controller 140 can be mounted on, beneath, or adjacent to substrate 110. Alternatively, the controller can be mounted separately from the substrate 110 and use wired connections, board connected electrical traces, or another suitable interconnect mechanism. The LED controller 140 can include necessary circuitry so as to enable the operation of the plurality of LEDs 120. The LED controller can be unitary or be composed of multiple distinct modules in wired or wireless interconnection. For example, the LED controller 140 can include a separate power supply, a wireless interconnect, and remote logic on a dedicated light interface device or app supported by a smartphone.

The substrate 110 can include a laminated printed circuit board, a ceramic board, glass board, or plastic board. The substrate can be rigid or flexible. Furthermore, the substrate 110 can include the necessary traces and circuitry to enable individual or grouped operation of the LEDs 120. Electrical connection between controller 140 and LEDs 120 can be formed by direct wiring, electrical trace layout, side or bottom vias, or suitable combinations thereof. In certain embodiments, transparent conductors such as indium tin oxide (ITO) can be used to form top or side contacts.

In some embodiments, each LED can be separately controlled by controller 140, while in other embodiments groups of LEDs can be controlled as a block. In still other embodiments, both single LEDs and groups of LEDs can be controlled. To reduce overall data management requirements, the controller 140 can be limited to on/off functionality or switching between relatively few light intensity levels. In other embodiments, continuous changes in lighting intensity are supported. Both individual and group level control of light intensity is contemplated. In one embodiment, overlapping or dynamically selected zones of control are also possible, with for example, overlapping groups of LEDs 120 being separately controllable despite having common LEDs depending on lighting requirements. In one embodiment, intensity can be separately controlled and adjusted by setting appropriate ramp times and pulse width for each LED using a pulse width modulation module within controller 140. This allows staging of LED activation to reduce power fluctuations, and to provide superior luminous intensity control.

The LEDs 120 can include but are not limited to LEDs formed of sapphire or silicon carbide. The LEDs 120 can be formed from an epitaxially grown or deposited semiconductor n-layer. A semiconductor p-layer can then be sequentially grown or deposited on the n-layer, forming an active region at the junction between layers. Semiconductor materials capable of forming high-brightness light emitting devices can include, but are not limited to, Group III-V semiconductors, particularly binary, ternary, and quaternary alloys of gallium, aluminum, indium, and nitrogen, also referred to as III-nitride materials. In certain embodiment, laser light emitting elements can be used.

Color of emitted light from the LEDs 120 can be modified using a phosphor contained in glass, or as a pre-formed sintered ceramic phosphor, which can include one or more wavelength converting materials able to create white light or monochromatic light of other colors. All or only a portion of the light emitted by the LEDs 120 may be converted by the wavelength converting material of the phosphor. Unconverted light may be part of the final spectrum of light, though it need not be. Examples of common devices include a blue-emitting LED segment combined with a yellow-emitting phosphor, a blue-emitting LED segment combined with green- and red-emitting phosphors, a UV-emitting LED segment combined with blue- and yellow-emitting phosphors, and a UV-emitting LED segment combined with blue-, green-, and red-emitting phosphors. In some embodiments, individually controllable RGB (three LEDs) or RGBY (four LEDs) can be positioned under a single micro-optic. This allows for precise color control of emitted light.

Direction, beam width, and beam shape of light emitted from each LED 120 can be modified by micro-optics 130. Micro-optics 130 can be a single optical element or a multiple optic elements. Optical elements can include converging or diverging lenses, aspherical lens, Fresnel lens, or graded index lens, for example. Other optical elements such as mirrors, beam diffusers, filters, masks, apertures, collimators, or light waveguides are also included. Micro-optics 130 can be positioned at a distance from the LEDs that allows receipt and redirection of light from multiple LEDs 120. Alternatively, micro-optics 130 can be set atop each LED 120 to individually guide, focus, or defocus emitted LED 120 light. Micro-optics 130 can be directly attached to the LEDs 120, attached to LEDs 120 via a transparent interposer or plate, or held at a fixed distance from LEDs 120 by surrounding substrate attachments (not shown).

Figure 1B:
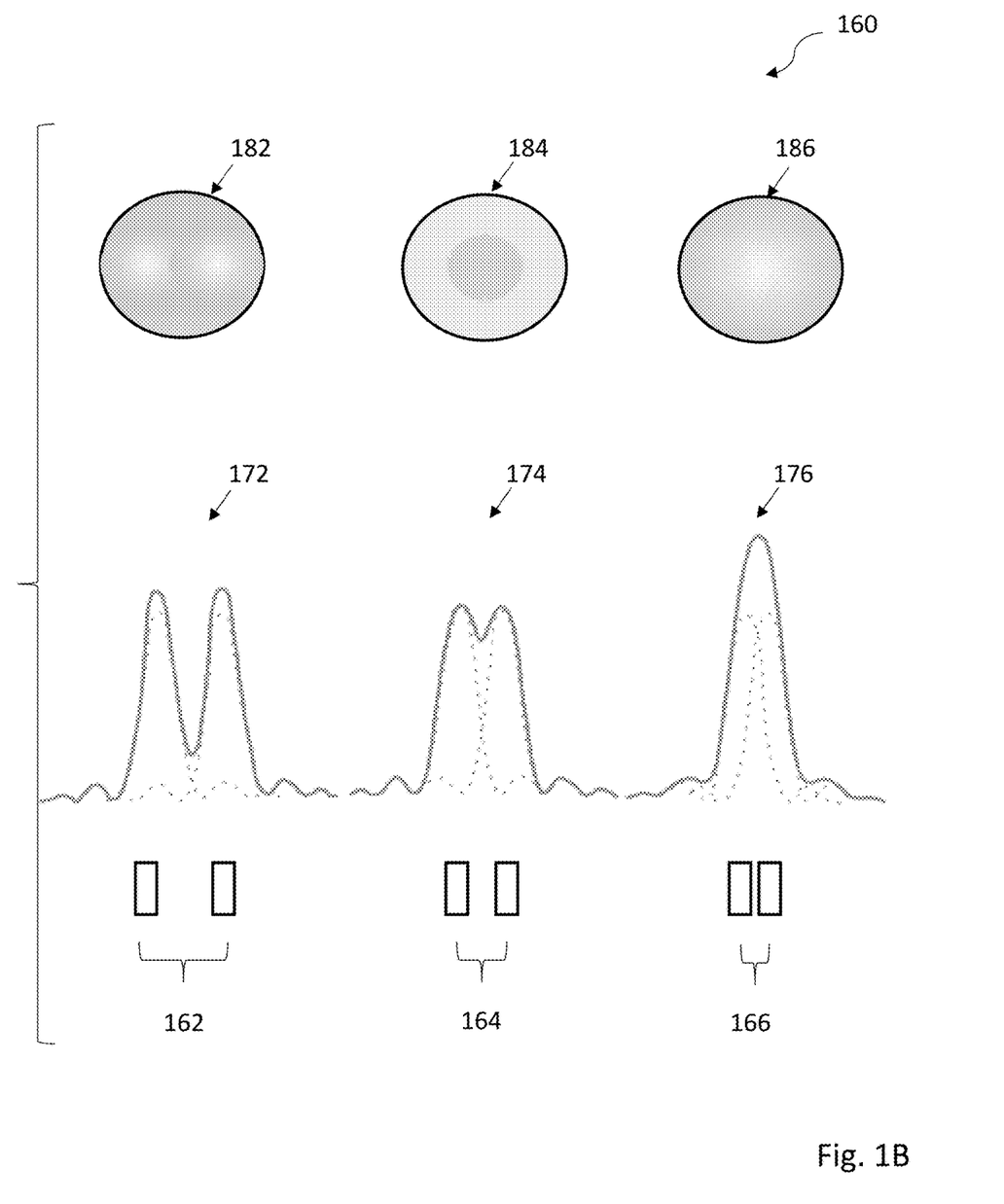
FIG. 1B is a diagram illustrating a Rayleigh distance separation of millimeter-scale spaced apart LEDs and micro-optics.

In one embodiment, LEDS are situated no further apart from each other than is necessary to present a substantially uniform visual appearance and provide a substantially uniform light beam. This requires that point-like sources be separated by distance that defines an angle smaller than the resolvable angular resolution for a user viewing at a normal distance (e.g. the distance from a standing or sitting user to light in a ceiling). FIG. 1B illustrates this with a graphic 160 illustrating a Rayleigh distance separation of millimeter-scale spaced apart LEDs and micro-optics. As seen in graph 160, pairs of LEDs 162, 164, and 166 are separated by an increasingly smaller distance. LEDs 162 are separated from each other by a distance and corresponding viewable angular separation at a distance (e.g. typically 1-2 meters) sufficient to distinguish each LED as a separate light source. A user looking at the LEDs would clearly see two distinct bright spots 182 having distinct dual light intensity peaks 172.

Placing the LEDs closer together can eliminate the perception of distinct bright spots. LEDs 166 are so closely spaced that the individual light intensity peaks from each LED beam are combined into a single peak 176 that presents a generally uniform visual impression, with some slight brightening 186 in the center.

Placing the LEDs 164 at an intermediate distance determined to be a Rayleigh distance separation or smaller can provide light intensity peaks 174 that are basically indistinguishable, giving a generally uniform visual impression 184. Rayleigh distance can be determined by considering diffraction through a circular aperture, which is:

$$\theta = 1.220 \frac{\lambda}{D}$$

where θ is the angular resolution (radians), λ is the wavelength of light, and D is the pupil diameter of a user viewing the separated LEDs. Determining the Rayleigh distance allows a further determination of LED spacing for a user viewing the LEDs at a distance typically between 1-2 meters distant. Typically, this LED separation distance will be 1 millimeter or less for sub-millimeter sized LEDs with associated micro-optics. In some embodiments, this distance can be increased by providing diffuser layers, wide beam optics, or mirror systems. Unfortunately, this reduces ease of manufacture and increases both the Z-height and expense of the LED systems.

Figure 1C:
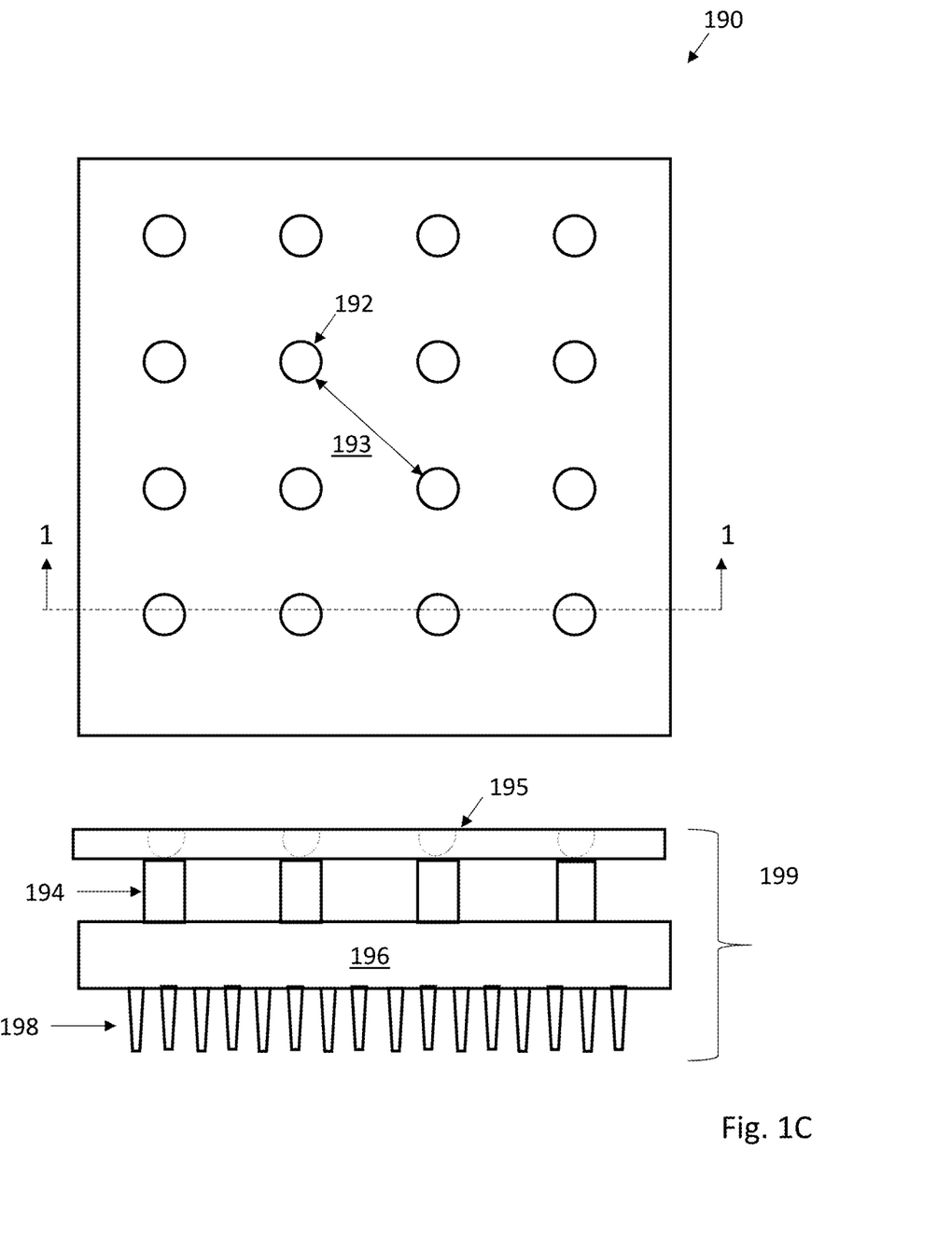
FIG. 1C is a diagram illustrating a low Z-height LED illumination system with multiple millimeter-scale spaced apart LEDs and micro-optics supported by a substrate.

FIG. 1C is a diagram illustrating a low Z-height LED illumination system 190 with multiple millimeter-scale spaced apart LED units 192 formed from a combination of LEDs 194 and sheet embedded micro-optics 195. The LEDs 194 are supported by a substrate 196 (e.g. a printed circuit board or ceramic substrate that supports electrical traces or vias) that has attached heat spreader fins 198. The total Z-height 199 of the system is minimized, with a Z-height typically being less than 1 centimeter for millimeter or less sized LED sources. In some embodiments, Z-height for the LED illumination system 190 is set to be no greater than five (5) times the height of the LEDs 194.

Figure 2:
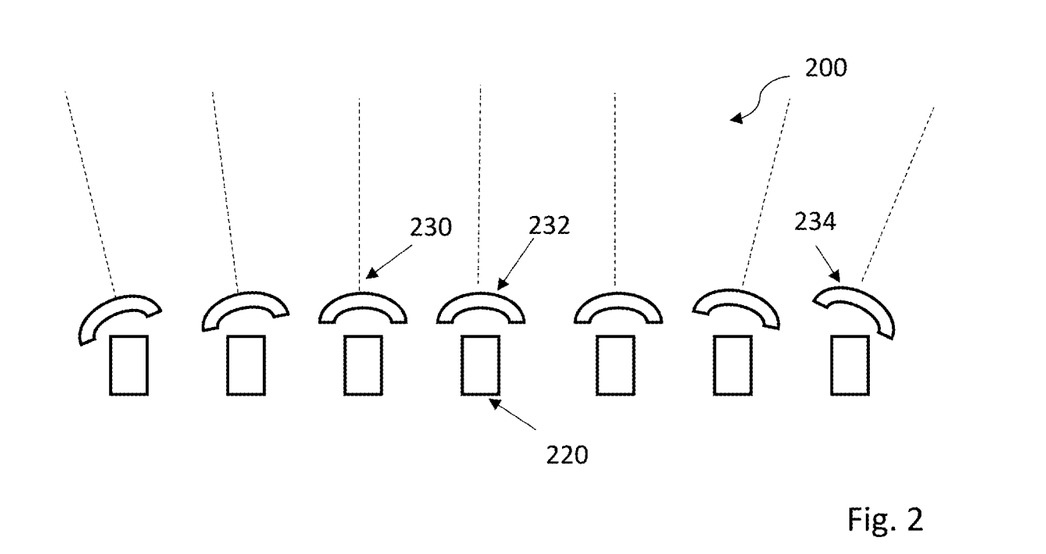
FIG. 2 illustrates multiple millimeter-scale spaced apart LEDs and micro-optics with both on-axis and off-axis associated micro-optics.

Low Z-height systems can support various light beam orientations. For example, FIG. 2 illustrates an illumination system 200 with multiple millimeter-scale spaced apart LEDs 220 and micro-optics 230 with both on-axis (e.g. micro-optic 232) and off-axis (e.g. micro-optic 232) associated micro-optics.

Figure 3:
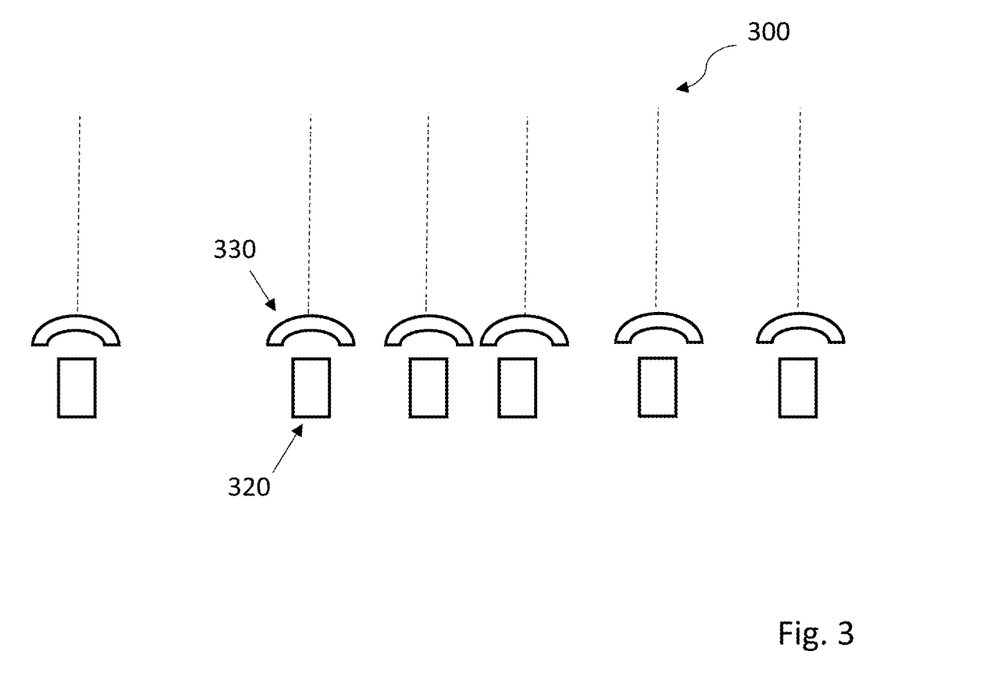
FIG. 3 illustrates multiple millimeter-scale spaced apart LEDs with associated micro-optics, arranged to have non-symmetric, irregular spacing.

FIG. 3 illustrates an illumination system 300 with multiple millimeter-scale spaced apart LEDs 320 with associated micro-optics 330, arranged to have non-symmetric, irregular spacing. One-dimensional, two-dimensional, and three-dimensional non-symmetric or irregular layouts of LEDs 320 with associated micro-optics 330 is contemplated. Two-dimensional layouts can be constructed from adjacent or contiguous positioning of one-dimensional substrates. Three-dimensional layouts can be constructed from multiple stacked layers of two-dimensional substrates. Stacked substrates can be transparent, or include defined apertures offset from supported LEDs 320 to permit exit of light from lower layers. In other embodiments, symmetrical one-dimensional, two-dimensional, and/or three-dimensional arrays of LEDs 320 can be used, as well as combinations of symmetrical and non-symmetrical layouts.

Figure 4:
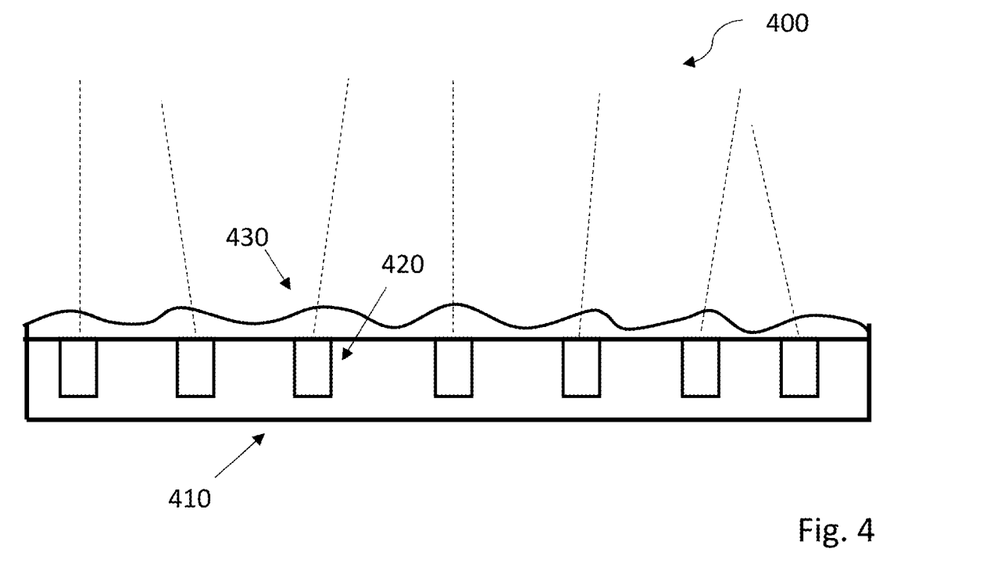
FIG. 4 illustrates multiple millimeter-scale spaced apart LEDs embedded in a substrate, with an overlaying continuous optical plate including aspheric optics.

FIG. 4 illustrates an illumination system 400 with multiple millimeter-scale spaced apart LEDs 420 embedded in a substrate 410, with an overlaying continuous optical plate 420 including aspheric optics. LEDs 420 can be positioned by a pick and place machine or other suitable carrier in multiple holes defined in substrate 410, Alternatively, epoxy, thermoset plastics, plastic molds, or similar substrates can be defined around LEDs 420 held in position. The plate 420 can be adhesively attached to the substrate 410. The plate can include on or off-axis micro-optics, or irregular aspheric micro-optics as shown. In certain embodiments, spherical optics can be used.

Figure 5:
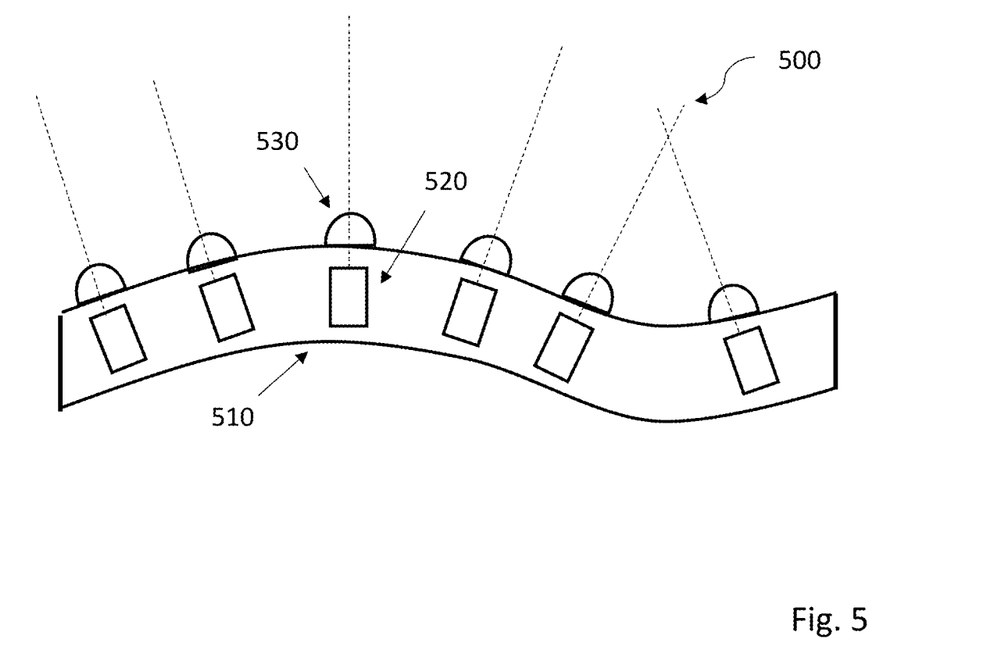
FIG. 5 illustrates multiple millimeter-scale spaced apart LEDs embedded in a flexible substrate.

FIG. 5 illustrates an illumination system 500 with multiple millimeter-scale spaced apart LEDs 520 embedded in a transparent, flexible substrate 510. Micro-optics 530 can be attached to the substrate 510. This design is of particular use for architectural applications that require corner or curved surface mounting.

Programmable light emitting arrays such as disclosed herein may support a wide range of applications that benefit from fine-grained intensity, spatial, and temporal control of light distribution. This may include, but is not limited to, precise spatial patterning of emitted light from blocks or individual LEDs. Depending on the application, emitted light may be spectrally distinct, adaptive over time, and/or environmentally responsive. In some embodiments, the light emitting arrays may provide pre-programmed light distribution in various intensity, spatial, or temporal patterns. The emitted light may be based at least in part on received sensor data and may be used for optical wireless communications. Associated optics may be distinct at single or multiple LED level. An example light emitting array may include a device having a commonly controlled central block of high intensity LEDS with an associated common optic, whereas edge positioned LEDs may have individual optics. Common applications supported by light emitting LED arrays include camera or video lighting, architectural and area illumination, and street lighting.

Programmable light emitting arrays may be used to selectively and adaptively illuminate buildings or areas for improved visual display or to reduce lighting costs. In addition, light emitting arrays may be used to project media facades for decorative motion or video effects. In conjunction with tracking sensors and/or cameras, selective illumination of areas around pedestrians may be possible. Spectrally distinct LEDs may be used to adjust the color temperature of lighting, as well as support wavelength specific horticultural illumination.

Street lighting is an important application that may greatly benefit from use of programmable light emitting arrays. A single type of light emitting array may be used to mimic various street light types, allowing, for example, switching between a Type I linear street light and a Type IV semicircular street light by appropriate activation or deactivation of selected LEDs. In addition, street lighting costs may be lowered by adjusting light beam intensity or distribution according to environmental conditions or time of use. For example, light intensity and area of distribution may be reduced when pedestrians are not present. If LEDs are spectrally distinct, the color temperature of the light may be adjusted according to respective daylight, twilight, or night conditions.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims. It is also understood that other embodiments of this invention may be practiced in the absence of an element/step not specifically disclosed herein.

The invention claimed is:
1. A light source, comprising:
   a plurality of light emitting diodes, with each of the light emitting diodes sized between 30 microns and 500 microns; and
   a plurality of micro-optics sized less than 1 millimeter, each micro-optic positioned over one or more of the plurality of light emitting diodes, each micro-optic and the one or more light emitting diodes over which it is positioned together forming a light emitting diode unit with adjacent light emitting diode units separated from each other by no more than a distance $d=(L)(\theta)$, where:
- L=a distance of 2 meters from the light source to a viewer;
- $\theta=1.220\lambda/D$ in radians;
- $\lambda$ is a wavelength of light emitted by the light emitting diodes; and
- D is a pupil diameter of the viewer.

2. The light source of claim 1, wherein adjacent light emitting diodes are positioned at least 1 millimeter apart.

3. The light source of claim 1, wherein Z-height of the light source is less than 1 centimeter.

4. The light source of claim 1, wherein light emitting diodes are flip chip mounted and further comprise a phosphor conversion layer.

5. The light source of claim 1, wherein at least some of the plurality of light emitting diodes are individually controlled through connected traces.

6. The light source of claim 1, wherein at least two of the plurality of light emitting diodes are positioned under a single micro-optic.

7. The light source of claim 1, wherein at least four of the plurality of light emitting diodes are RGBY LEDs positioned under a single micro-optic.

8. The light source of claim 1, wherein at least some of the plurality of light emitting diodes are positioned under a single off-axis micro-optic.

9. The light source of claim 1, wherein the light source is used for architectural lighting.

10. The light source of claim 1, wherein a combined height of the light emitting diode units and a supporting substrate on which they are arranged is less than 1 centimeter.

11. The light source of claim 10, wherein adjacent light emitting diodes are positioned at least 1 millimeter apart.

12. The light source of claim 10, wherein Z-height of the light source is less than 1 centimeter.

13. The light source of claim 10, wherein light emitting diodes are flip chip mounted and further comprise a phosphor conversion layer.

14. The light source of claim 10, wherein at least some of the plurality of light emitting diodes are individually controlled through connected traces.

15. The light source of claim 10, wherein at least two of the plurality of light emitting diodes are positioned under a single micro-optic.

16. The light source of claim 10, wherein at least four of the plurality of light emitting diodes are RGBY LEDs positioned under a single micro-optic.

17. The light source of claim 10, wherein at least some of the plurality of light emitting diodes are positioned under a single off-axis micro-optic.

18. The light source of claim 10, wherein the light source is used for architectural lighting.

* * * * *